US006173163B1

(12) United States Patent
Northcutt (10) Patent No.: US 6,173,163 B1
(45) Date of Patent: *Jan. 9, 2001

(54) SWITCHED SAMPLING SYSTEMS AND METHODS FOR MONITORING RADIO TRANSMIT POWER

(75) Inventor: John Northcutt, Chapel Hill, NC (US)

(73) Assignee: Ericsson Inc., Research Triangle Park, NC (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/108,014

(22) Filed: Jun. 30, 1998

(51) Int. Cl.[7] ...................................... H04B 1/04
(52) U.S. Cl. ..................... 455/126; 455/127; 455/115; 455/553; 455/522
(58) Field of Search ..................... 455/522, 574, 455/126, 115, 552, 553, 127; 370/252, 337, 347; 330/279

(56) References Cited

U.S. PATENT DOCUMENTS

| 5,287,555 | * | 7/1991 | Wilson et al. | 455/115 |
| 5,363,071 | | 11/1994 | Schwent et al. | 333/111 |
| 5,369,789 | * | 10/1992 | Kosugi et al. | 455/126 |
| 5,423,081 | * | 8/1993 | Thiele et al. | 455/116 |
| 5,715,526 | * | 9/1995 | Weaver, Jr. et al. | 455/126 |
| 5,724,005 | * | 4/1996 | Chen et al. | 455/126 |
| 5,732,334 | * | 12/1996 | Miyake | 455/126 |
| 5,832,373 | * | 12/1996 | Nakanishi et al. | 455/126 |
| 5,852,770 | * | 9/1995 | Kasamatsu | 455/126 |
| 6,034,999 | * | 10/1997 | Krisawa | 455/126 |

* cited by examiner

Primary Examiner—Reinhard J. Eisenzopf
Assistant Examiner—Duc Nguyen
(74) Attorney, Agent, or Firm—Myers Bigel Sibley & Sajovec (57) ABSTRACT

A radio communications device includes a transmitter, a switch, and a measurement circuit wherein the transmitter transmits radio communications at a transmitted power. The switch couples a portion of the transmitted power during spaced apart intervals of time and blocks coupling of the portion of the transmitted power between the spaced apart intervals of time. The measuring circuit measures the coupled portion of the transmitted power during the spaced apart intervals of time. The radio communications device can also include a feedback circuit that maintains the transmitted power at a desired level responsive to the coupled portion of the transmitted power.

52 Claims, 2 Drawing Sheets

SWITCHED SAMPLING SYSTEMS AND METHODS FOR MONITORING RADIO TRANSMIT POWER

FIELD OF THE INVENTION

The present invention relates to the field of radio communications, and more particularly to transmitter power controls and methods for radio communications.

BACKGROUND OF THE INVENTION

Radiotelephone transmitters generally include an automatic gain control loop to maintain a desired transmission power level out of the antenna. Without such a gain control loop, the transmission power might vary as a function of factors such as transmission frequency, battery voltage, and/or temperature.

In particular, a portion of the power generated by the transmitter power amplifier can be coupled through a capacitor to a rectifier where it is converted to a voltage. This voltage can then be digitized and compared to a calibrated digital code at the radiotelephone microprocessor. A control signal from the microprocessor is used to adjust a variable gain amplifier when the digitized voltage is not equal to the calibrated digital code to maintain the desired transmission power.

Because a portion of the power generated by the transmitter is coupled through the feedback loop, however, the efficiency of the transmitter is reduced. Because the power amplifier generates more power than is actually transmitted through the antenna, the battery life may be reduced. A lower coupling capacitance may thus provide lower coupling and higher efficiency. Proper operation of the feedback loop, however, may dictate a certain level of coupling and the resulting inefficiency.

Moreover, a radiotelephone transmitter may operate at one of a plurality of transmission power levels depending on a signal strength desired at the time. For example, radiotelephones according to the IS-136 standard (IS-136 dual-mode dual band radiotelephones) may transmit at one of eight different transmission power levels ranging from 28 dBm to −4 dBm. Choosing a capacitance value for the coupling capacitor, however, may be difficult over this range of transmission power levels. In particular, a lower value coupling capacitance provides lower coupling and thus higher efficiency, but the lower capacitance may couple insufficient power at the lower power levels to maintain operation of the feedback loop. Higher capacitor values may provide sufficient power coupling at lower power levels for operation of the feedback loop, but the reduced efficiency may significantly reduce the radiotelephone battery life.

U.S. Pat. No. 5,363,071 to Schwent et al. discusses a method for varying coupling of a radio frequency signal. This is accomplished by selecting between a first operating mode of the RF coupler having strong coupling, responsive to a first predetermined power level, such that the RF coupler produces a first coupled RF signal responsive to the RF signal and a second operating mode of the RF coupler having weak coupling, responsive to a second predetermined power level, such that the RF coupler produces a second coupled RF signal responsive to the RF signal. The strongly and weakly coupled RF signals, however, may still contribute to undesired transmission inefficiencies.

Furthermore, it may be difficult to provide a cost effective analog-to-digital converter having useful resolution over the range of power levels discussed above. For example, a 32 dB range of output powers may be difficult to measure using a conventional 8 bit analog-to-digital converter. In conventional arrangements, the highest code of the analog-to-digital converter is set at the maximum operating voltage of the converter, and the lowest code is set at ground. Accordingly, there is a voltage range near the supply voltage and ground where the digital code is variable or redundant. For example, if the supply voltage is 3.3V and there is a 300 mV range of uncertainty, the analog-to-digital converter may only be able to reliably convert from 0.3V to 3V providing a dynamic range of:

$$|x|=20 \log(0.3/3)=20 \text{ dB}.$$

For the reasons discussed above, it may be difficult to provide useful feedback at lower power levels. Accordingly, radiotelephones may effectively provide open loop transmit operations at the lower power levels thereby reducing performance thereof. Furthermore, known feedback loops may result in undesired transmission inefficiencies.

SUMMARY OF THE INVENTION

It is therefore an object of the present invention to provide improved transmission systems and methods for radio communications devices.

It is another object of the present invention to provide transmission systems and methods having improved efficiency for radio communications devices.

It is still another object of the present invention to provide transmission systems and methods having improved power control feedback loop operation.

These and other objects are provided according to the present invention by coupling a portion of the transmitted power during spaced apart intervals of time and blocking coupling of the portion of the transmitted power between the spaced apart intervals of time. In other words, the transmission power is sampled so that a portion of the transmitted power is coupled into the feedback loop only during the sampling intervals. By not coupling transmission power into the feedback loop outside the sampling intervals, a greater portion of the transmitter power reaches the antenna thus improving the transmitter efficiency thereby increasing battery life.

According to an embodiment of the present invention, a radio communications device can include a transmitter, a switch, and a measuring circuit wherein the transmitter transmits radio communications at a transmitted power. The switch couples a portion of the transmitted power during spaced apart intervals of time and blocks coupling of the portion of the transmitted power between the spaced apart intervals of time. The measuring circuit measures the coupled portion of the transmitted power during the spaced apart intervals of time. Accordingly, a feedback circuit can maintain the transmitted power at a desired level responsive to the coupled portion of the transmitted power measured by the measuring circuit. By blocking coupling between the spaced apart intervals of time, the efficiency of the transmitter can be increased.

The transmitted power is preferably selected from one of a plurality of predetermined power levels. In addition, the measuring circuit can include first and second attenuating circuits, and a multiplexer. The first and second attenuating circuits provide respective first and second samples of the coupled portion of the transmitted power at respective first and second levels of attenuation. The multiplexer multiplexes the first sample of the coupled portion of the transmitted power for a first range of the predetermined power levels and the multiplexer multiplexes the second sample of the coupled portion of the transmitted power for a second range of the predetermined power levels. Accordingly, a single analog-to-digital converter can be used to measure the full range of power levels with improved dynamic range. In essence, the attenuating circuits scale the first and second ranges of power levels so that each of the first and second ranges of power levels can be measured using the full dynamic range of the single analog-to-digital converter.

The first and second attenuating circuits can include respective first and second voltage dividers. In particular, the first voltage divider can be coupled between the switch and a reference voltage, and the second voltage divider can be coupled between an output node of the first voltage divider and the reference voltage. Accordingly, the first voltage divider provides a first level of attenuation, and the second voltage divider provides a second level of attenuation greater than the first level of attenuation.

The spaced apart intervals of time preferably occur for a duration and at a rate so that transmission noise is reduced. Each of the spaced apart intervals of time is thus preferably less that 5 ms. Furthermore, the portion of the transmitted power is preferably coupled at a frequency in a range outside an audio range of the radio communications device. In particular, the frequency of coupling can be less than 300 Hz or greater than 3000 Hz.

The radio communications device can also be a dual mode device providing both analog and time division multiple access (TDMA) communications. During analog communications transmissions, the switch couples the portion of the transmitted power during the spaced apart intervals of time and blocks coupling of the portion of the transmitted power between the spaced apart intervals of time as discussed above. Accordingly, coupling inefficiencies may be reduced during analog transmissions where transmission is continuous. During TDMA communications transmission, the switch couples the portion of the transmitted power during the complete TDMA transmission. Transmission noise during the TDMA communication may thus be reduced without significant impact on transmission efficiency because the transmission only occurs during designated TDMA time slots which make up one third (or less) of the transmission time. In other words, transmission efficiency may be increased during TDMA communications because transmission is not continuous.

The methods and systems of the present invention can thus provide improved transmission efficiency and increased battery life by coupling a portion of the transmit power only during spaced apart intervals of time. The performance of an analog-to-digital converter used to measure the coupled transmit power can also be increased over a full range of transmit powers. Accordingly, transmission power control and efficiency for radio communications devices can be improved.

DETAILED DESCRIPTION

The present invention will now be described more fully hereinafter with reference to the accompanying drawings in which a preferred embodiment of the invention is shown. The present invention may, however, be embodied in many different forms and should not be construed as limited to the embodiment set forth herein; rather, this embodiment is provided so that this disclosure will be thorough and complete, and will fully convey the scope of the invention to those skilled in the art.

Figure 1:
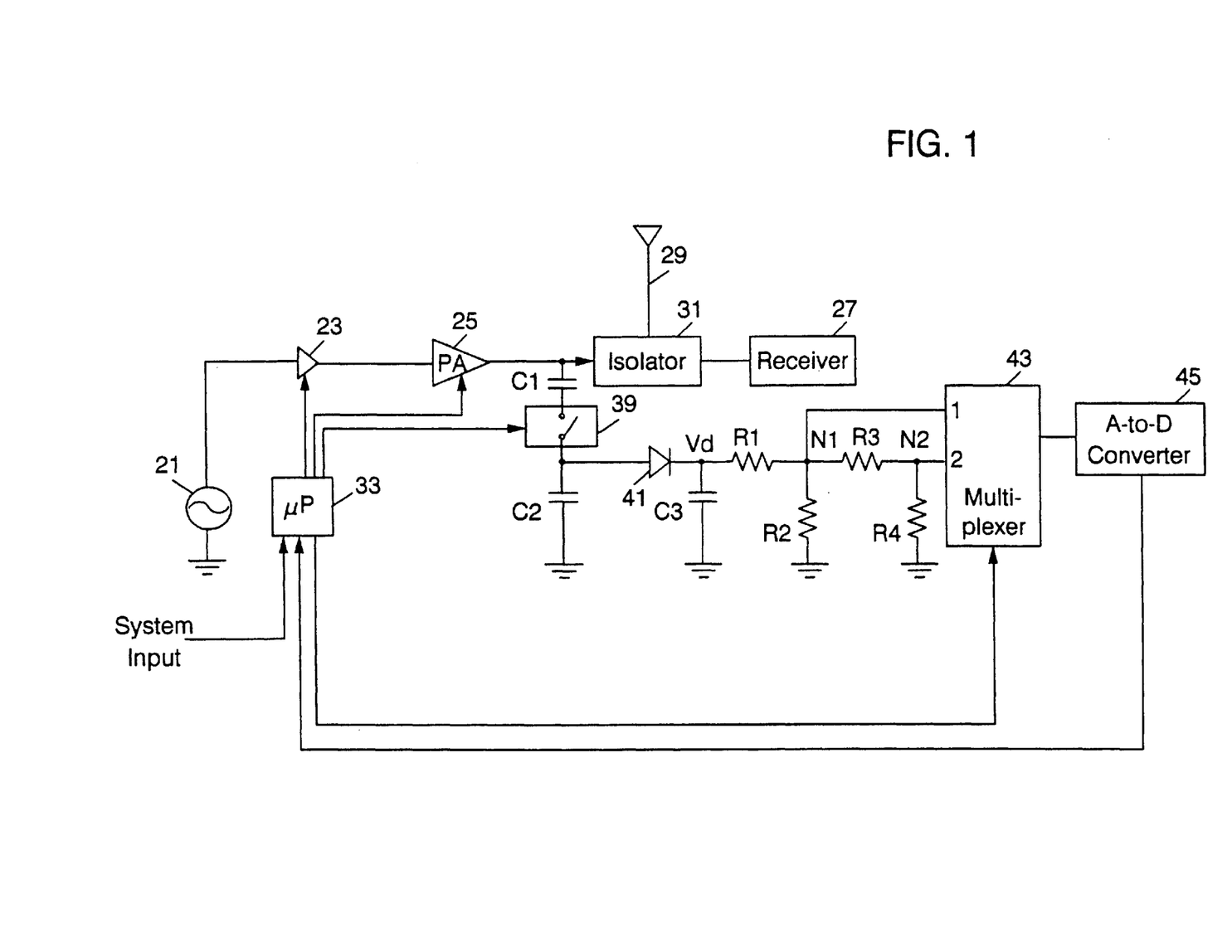
FIG. 1 is a schematic diagram illustrating a radiotelephone including a transmission power feedback loop according to the present invention.

As shown in FIG. 1, a radiotelephone according to the present invention can include a transmitter that transmits radiotelephone communications including a transmission signal generator 21, a variable gain amplifier (VGA) 23, and a power amplifier (PA) 25; and a receiver 27 that receives radiotelephone communications. The transmission signal generator 21 can include a microphone, key pad, system processor, and/or any other components that generate electronic information to be transmitted. The transmitter and receiver are coupled to an antenna 29 through the isolator 31 to isolate the transmitted and received radiotelephone communications. The operation of the transmitter and receiver components discussed above will be understood by those having skill in the art and will thus not be discussed further herein.

While the methods and systems of the present invention are discussed herein in the context of a radiotelephone, it will be understood that the term radiotelephone includes cellular and non-cellular radiotelephones, satellite radiotelephones, computers including radio modems, personal digital assistants (PDAs), or any other device capable of radiotelephone communications. The methods and systems of the present invention can also be applied more generally to other radio communications devices.

The radiotelephone of FIG. 1 also includes a feedback loop used to control the transmission power generated by the power amplifier 25. The feedback loop provides a feedback signal to a microprocessor ($\mu$P) 33 which generates a control signal responsive to the feedback signal to adjust the variable gain amplifier 23. Accordingly, differences in the transmission power resulting from variations in parameters such as transmission frequency, battery voltage, and temperature can be reduced.

The efficiency of the radiotelephone can be increased by reducing the transmission power coupled into the feedback loop. As shown, the feedback loop includes capacitors C1, C2, and C3; a switch 39; a rectifying diode 41; resistors R1, R2, R3, and R4; a multiplexer 43, an analog-to-digital (A-to-D) converter 45; and the microprocessor 33. In particular, the switch 39 is coupled in series between the capacitor C1 and the rest of the feedback circuit. Accordingly, when the switch 39 is closed, a portion of the transmission power generated by the power amplifier 25 is coupled to the feedback circuit. When the switch 39 is open, transmission power generated by the power amplifier circuit is not coupled into the feedback circuit thereby increasing the efficiency of the transmitter.

Figure 2:
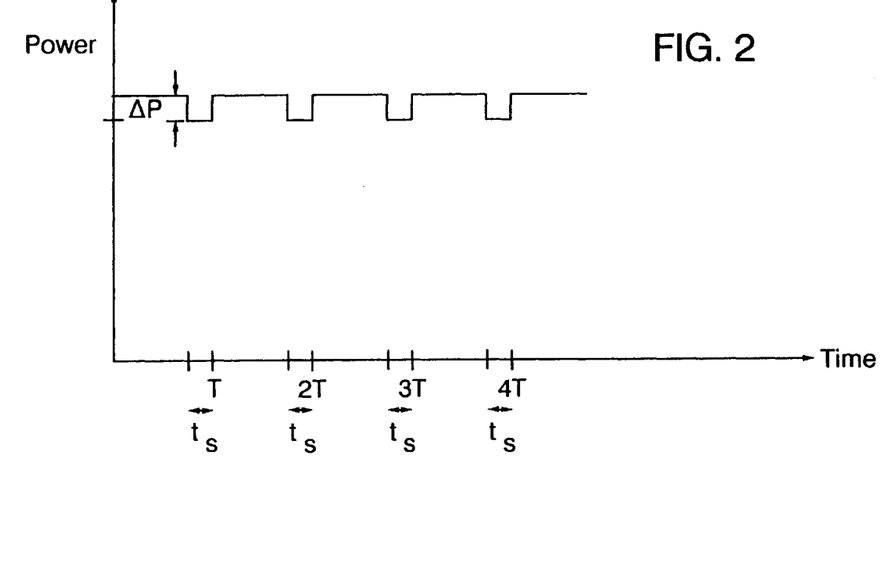
FIG. 2 is a graph illustrating the power transmitted by the radiotelephone of FIG. 1 during analog operations.

The radiotelephone of FIG. 1 uses the switch 39 to provide sampled (as opposed to continuous) transmission power feedback. Accordingly, the transmission power delivered to the antenna is only reduced by coupling to the feedback circuit during the periods of time when the transmission power is being sampled with the switch 39 closed. When the switch is opened, the feedback circuit is decoupled from the output of the power amplifier 25 thereby increasing the efficiency of the transmitter. As shown in FIG. 2, the transmission power is reduced during the sampling intervals $t_s$ by an amount $\Delta P$. Outside the sampling intervals, the full transmission power is delivered to the antenna. Accordingly, it may be desirable to compensate for the reduction ΔP in transmission power when transmission power is sampled during the sampling intervals $t_s$. For example, ½ dB of power (ΔP) may be coupled into the feedback circuit and away from the antenna during the sampling intervals, and compensation for this loss may improve the accuracy at which radio frequency power is transmitted from the antenna. In other words, the microprocessor can compensate for the power reduction that occurs when the transmission power is measured to more accurately control the variable gain amplifier and thus the power transmitted from the antenna.

The difference in the amplitude of the transmission power resulting from the switched coupling of the feedback circuit could result in amplitude modulation of the transmitted communications that could be audible on the receiving end. The transmission power is thus preferably sampled in a manner that reduces noise transmitted with the transmitted radiotelephone communications. In analog radiotelephone communications, the noise can be reduced by choosing the sampling rate (or frequency) 1/T and the sampling interval $t_s$ to avoid the generation of noise in the radiotelephone's audio range. In particular, the sampling rate 1/T should be outside the radiotelephone's audio range which is 300 Hz to 3000 Hz for a radiotelephone, and the sampling interval $t_s$ should be less than 5 ms. The sampling rate and interval can thus be chosen to reduce degradation of transmitted analog voice quality.

In a radiotelephone providing both analog Frequency Modulation (FM) operation and digital Time Division Multiple Access (TDMA) operation, such as a telephone according to the IS-136 standard, it may be advantageous to provide sampled transmission power feedback during analog operations and to provide continuous transmission power feedback during digital operations. During analog communications transmissions, the radiotelephone transmits continuously over the assigned frequency channel, and the transmission power is sampled during the sampling time intervals $t_s$ as shown in FIG. 2. Transmission efficiency is thereby increased because the power loss ΔP only occurs during the sampling intervals, and the full transmission power generated by the power amplifier is coupled to the antenna between the sampling time intervals. As discussed above, transmission noise can be reduced in the analog mode by careful selection of the duration of the sampling time interval and the sampling rate.

Figure 3:
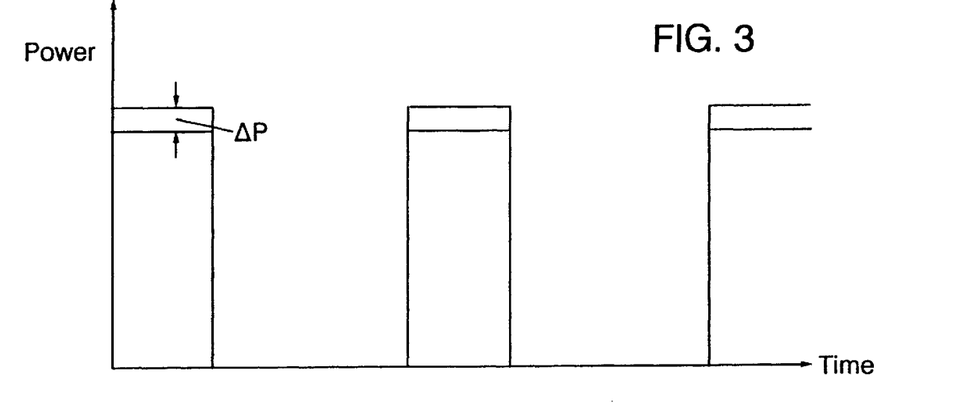
FIG. 3 is a graph illustrating the power transmitted by the radiotelephone during digital TDMA operations

During digital TDMA communications, however, it may be difficult to sample the transmission power with the switch 39 without generating an undesirable level of transmission noise. More particularly, a digital TDMA channel is defined by a frequency and a time slot within a frame of time slots so that a digital TDMA frequency supports three or more digital TDMA channels. In a radiotelephone system according to the IS-136 standard, three time slots are provided in each frame, each time slot has a duration of approximately 6.66 ms, and amplitude information is a part of the π/4 rotated Differential Quadrature Phase Shift Keying (DQPSK) modulation. Accordingly, the switch is preferably maintained closed during digital TDMA communications as shown in FIG. 3.

The continuous transmission power sampling during digital TDMA communications, however, need not significantly reduce transmission efficiency because transmission only occurs during the time slots for the designated transmission channel. As shown in FIG. 3, the power loss ΔP due to coupling to the feedback circuit only occurs during the time slot during which the radiotelephone is transmitting. In other words, digital TDMA communications operations provide improved transmission efficiency because transmission only occurs during designated time slots making up one third of the total transmission time in an IS-136 radiotelephone system. Accordingly, losses due to coupling with the feedback circuit may not be as significant in digital TDMA operations.

Furthermore, the switch can be closed to provide continuous coupling with the feedback circuit during operations where especially low signal to noise ratios are desirable. For example, it may be desirable to provide continuous power sampling during the analog mode when 10 kbps data is transmitted. In other words, the switch can be continuously closed during analog transmission operations where lower signal to noise ratios are desired.

As shown in FIG. 1, the feedback circuit is decoupled from the output of the power amplifier when the switch 39 is open so that increased power is provided to the antenna 29. When the switch 39 is closed, the output of the power amplifier circuit is coupled to the feedback circuit through the capacitor C1 and the switch 39. A portion of the transmission power is thus coupled to the rectifier diode 41 which provides a rectified output voltage at the node Vd. A first voltage divider including resistors R1 and R2 is coupled between the node Vd and ground, and the first voltage divider defines a first output node N1. A second voltage divider including resistors R3 and R4 is coupled between the node N1 and ground, and the second voltage divider defines a second output node N2. Accordingly, respective output voltages are generated at nodes N1 and N2 in proportion to the rectified output voltage at node Vd wherein the first output voltage at node N1 is less attenuated than the second output voltage at node N2. As will be discussed in greater detail below, the first and second output voltages are used to increase the dynamic range of the analog-to-digital converter 45.

In particular, a two input multiplexer 43 is coupled between the nodes N1 and N2 and the analog-to-digital converter 45, and the multiplexer operates under the control of the microprocessor 33. Moreover, the multiplexer couples the node N1 to the converter 45 when the radiotelephone is transmitting in a first range of relatively low power levels, and the multiplexer couples the node N2 to the converter 45 when the radiotelephone is transmitting in a second range of relatively high power levels. The microprocessor then decodes the output of the converter according to the input of the multiplexer coupled thereto.

The use of the two voltage dividers allows two levels of attenuation to be applied to the rectified output voltage at node Vd. The first output voltage generated at node N1 has a first level of attenuation while the second output voltage generated at node N2 has a second level of attenuation greater than the first level of attenuation. Accordingly, radiotelephone transmissions transmitted in a first relatively low range of power levels can be measured at node N1 with a relatively low attenuation, while radiotelephone transmissions transmitted in a second relatively high range of power levels can be measured at node N2 with a relatively higher attenuation. The high and low ranges of transmission power levels can thus be scaled for measurement by the single analog-to-digital converter 45 thereby increasing the effective dynamic range of the A-to-D converter 45.

The microprocessor 33 receives the output of the A-to-D converter 45 and compares the measured transmission power with the desired transmission power. A control signal is generated by the microprocessor 33 in response to significant differences between the measured and desired transmission powers to adjust the output of the variable gain amplifier 23 thereby maintaining a desired transmission power. The microprocessor 33 controls the operation of the variable gain amplifier 23, the power amplifier 25, the switch 39, and the multiplexer 43 so that the appropriate multiplexer 43 input is coupled to the converter 45 for the transmission power level generated by the power amplifier 25; so that the converter output is appropriately decoded for the multiplexer input coupled to the converter 45; and so that the transmission power feedback is measured when the switch 39 is closed. Furthermore, the microprocessor operates according to system inputs to determine whether to provide analog or digital TDMA communications. While the system inputs, such as power level input, are shown as being applied externally, the system input can be generated within the microprocessor responsive to communications received from the radiotelephone communications system.

According to an example of the present invention, the radiotelephone is a dual mode radiotelephone providing both analog FM and digital TDMA communications according to the IS-136 standard. During analog communications, the transmission power is sampled periodically using the switch 39 as discussed above with regard to FIG. 2. More particularly, transmission power is selected from one of the following eight transmission power levels: −4 dBm, 0 dBm, 8 dBm, 12 dBm, 16 dBm, 20 dBm, 24 dBm, and 28 dBm. For lower transmission power levels ranging from −4 dBm to 8 dBm, the multiplexer couples the A-to-D converter 45 to the output node N1 with lower attenuation. For higher transmission power levels ranging from 12 dBm to 28 dBm, the multiplexer couples the A-to-D converter to the output node N2 with higher attenuation. During sampling intervals, the microprocessor compares the output of the converter with a lookup table corresponding to the node coupled to the converter to determine if the transmission power should be adjusted.

During digital communications, the transmission power is continuously coupled to the feedback circuit by closing the switch 39 to reduce transmission noise. The microprocessor can thus monitor the output of the analog to digital converter without regard to sampling intervals.

While a portion of the RF power generated by the power amplifier 25 is illustrated as being capacitively coupled through the coupling capacitor C1, the RF power can be coupled using other means known to those having skill in the art such as magnetic coupling, inductive coupling, resistive coupling, coupling transmission lines, and/or aperture coupled waveguides, for example. Radio frequency coupling techniques are discussed, for example, in U.S. Pat. No. 5,363,071 to Schwent et al. entitled "Apparatus And Methods For Varying The Coupling Of A Radio Frequency Signal", the disclosure of which is hereby incorporated herein in its entirety by reference. The switch 39 can be a can be a PIN diode, a relay, a field effect transistor (FET) switch such as a GaAs switch, or any other switch known to those having skill in the art.

Furthermore, the microprocessor of the present invention can be implemented using one or more standard processors; one or more application specific integrated circuits; one or more integrated circuits; and/or combinations of the above. In addition, the microprocessor can be a conventional radiotelephone processor running additional firmware/software to support the switched coupling and multiplexing according to the present invention. The multiplexer and A-to-D converter can be implemented using one or more standard and/or custom integrated circuits, or either or both of the multiplexer and A-to-D converter can be implemented as a portion of the processor. Each of the switch, the capacitors, the diode, and the resistors of the control loop can be implemented discretely, as portions of one or more custom or standard integrated circuits, or as portions of the processor.

In the drawings and specification, there has been disclosed a typical preferred embodiment of the present invention and, although specific terms are employed, these terms are used in a generic and descriptive sense only and not for purposes of limitation, the scope of the invention being set forth in the following claims.

That which is claimed is:

1. A radio communications device comprising:
   means for transmitting radio communications at a transmitted power wherein said means for transmitting radio communications comprises an amplifier that generates said transmitted power and an antenna that transmits said transmitted power;
   means for coupling a portion of said transmitted power generated by the amplifier away from the antenna during spaced apart intervals of time wherein said spaced apart intervals of time occur while transmitting radio communications and for blocking coupling of said portion of said transmitted power away from the antenna between said spaced apart intervals of time; and
   means for measuring said coupled portion of said transmitted power during said spaced apart intervals of time.

2. A radio communications device according to claim 1 further comprising:
   means for maintaining said transmitted power at a desired level responsive to said means for measuring.

3. A radio communications device according to claim 1 wherein said transmitted power is selected from one of a plurality of predetermined power levels and wherein said measuring means comprises:
   means for providing respective first and second samples of said coupled portion of said transmitted power at respective first and second levels of attenuation during said spaced apart intervals of time; and
   means for multiplexing said first sample of said coupled portion of said transmitted power for a first range of said predetermined power levels and for multiplexing said second sample of said coupled portion of said transmitted power for a second range of said predetermined power levels.

4. A radio communications device according to claim 3 wherein said means for providing comprise respective first and second voltage dividers, wherein said first voltage divider is coupled between said means for coupling and a reference voltage, and wherein said second voltage divider is coupled between an output node of said first voltage divider and said reference voltage.

5. A radio communications device according to claim 1 wherein each of said spaced apart intervals of time is less than 5 ms while transmitting radio communications.

6. A radio communications device according to claim 1 wherein said portion of said transmitted power is coupled at a frequency in a range outside an audio range of the radio communications device while transmitting radio communications.

7. A radio communications device according to claim 6 wherein said frequency is chosen from a range selected from the group consisting of less than 300 Hz and greater than 3000 Hz.

8. A radio communications device according to claim 1 wherein said radio communications device provides analog communications and wherein said means for coupling comprises means for coupling said portion of said transmitted power during said spaced apart intervals of time and for blocking coupling of said portion of said transmitted power between said spaced apart intervals of time during transmission of said analog communications.

9. A radio communications device according to claim 1 further comprising means for compensating for transmission power coupled away from the antenna during said spaced apart intervals of time while transmitting radio communications.

10. A radio communications device according to claim 1 wherein said wherein said means for transmitting radio communications transmits radio communications continuously during a transmit interval such that said amplifier generates said transmitted power continuously over said transmit interval, wherein two of said spaced apart intervals of time occur within said transmit interval so blocking coupling of said portion of said transmitted power away from the antenna between said spaced apart intervals of time occurs within said transmit interval.

11. A radio communications device wherein said radio communications device provides both analog and time division multiple access (TDMA) communications, comprising:
means for transmitting radio communications at a transmitted power;
means for coupling a portion of said transmitted power during spaced apart intervals of time wherein said spaced apart intervals of time occur while transmitting radio communications and for blocking coupling of said portion of said transmitted power between said spaced apart intervals of time wherein said means for coupling comprises,
 means for coupling said portion of said transmitted power during said spaced apart intervals of time and for blocking coupling of said portion of said transmitted power between said spaced apart intervals of time during transmission of said analog communications, and
 means for coupling said portion of said transmitted power during a complete transmission of said time division multiple access (TDMA) communication; and
means for measuring said coupled portion of said transmitted power during said spaced apart intervals of time.

12. A radio communications device comprising:
means for transmitting radio communications from an antenna at a transmitted power wherein said transmitted power is selected from one of a plurality of predetermined power levels wherein said means for transmitting comprises an amplifier that generates the transmitted power and wherein the transmitted power is transmitted from said antenna;
means for providing respective first and second samples of a coupled portion of said transmitted power at respective first and second levels of attenuation;
means for multiplexing said first sample of said coupled portion of said transmitted power for a first range of said predetermined power levels and for multiplexing said second sample of said coupled portion of said transmitted power for a second range of said predetermined power levels;
measuring means for measuring said multiplexed sample of said coupled portion of said transmitted power; and
means for coupling a portion of said transmitted power generated by said amplifier away from said antenna and to said means for providing during spaced apart intervals of time wherein said spaced apart intervals of time occur while transmitting radio communications and for blocking coupling of said portion of said transmitted power away from said antenna between said spaced apart intervals of time.

13. A radio communications device according to claim 12 further comprising:
means for maintaining said transmitted power at a desired one of said predetermined power levels responsive to said means for measuring.

14. A radio communications device according to claim 12 wherein said means for providing comprise respective first and second voltage dividers, wherein said first voltage divider is coupled between said means for transmitting and a reference voltage, and wherein said second voltage divider is coupled between an output node of said first voltage divider and said reference voltage.

15. A radio communications device according to claim 12 wherein each of said spaced apart intervals of time is less than 5 ms while transmitting radio communications.

16. A radio communications device according to claim 12 wherein said portion of said transmitted power is coupled at a frequency in a range outside an audio range of the radio communications device while transmitting radio communications.

17. A radio communications device according to claim 16 wherein said frequency is chosen from a range selected from the group consisting of less than 300 Hz and greater than 3000 Hz.

18. A radio communications device wherein said radio communications device provides both analog and time division multiple access (TDMA) communications, said radio communications device comprising:
means for transmitting radio communications from an antenna at a transmitted power wherein said transmitted power is selected from one of a plurality of predetermined power levels;
means for providing respective first and second samples of a coupled portion of said transmitted power at respective first and second levels of attenuation;
means for multiplexing said first sample of said coupled portion of said transmitted power for a first range of said predetermined power levels and for multiplexing said second sample of said coupled portion of said transmitted power for a second range of said predetermined power levels;
measuring means for measuring said multiplexed sample of said coupled portion of said transmitted power; and
means for coupling a portion of said transmitted power between said means for transmitting and said means for providing during spaced apart intervals of time wherein said spaced apart intervals of time occur while transmitting radio communications and for blocking coupling of said portion of said transmitted power between said spaced apart intervals of time, wherein said means for coupling comprises,
 means for coupling said portion of said transmitted power during said spaced apart intervals of time and for blocking coupling of said portion of said transmitted power between said spaced apart intervals of time during transmission of said analog communication, and
 means for coupling said portion of said transmitted power during a complete transmission of said time division multiple access (TDMA) communication.

19. A radio communications device comprising:
- a transmitter that transmits radio communications at a transmitted power wherein said transmitter comprises an amplifier that generates said transmitted power and an antenna that transmits said transmitted power;
- a switch that couples a portion of said transmitted power generated by the amplifier away from the antenna during spaced apart intervals of time wherein said spaced apart intervals of time occur while transmitting radio communications and that blocks coupling of said portion of said transmitted power away from the antenna between said spaced apart intervals of time; and
- a measuring circuit that measures said coupled portion of said transmitted power during said spaced apart intervals of time.

20. A radio communications device according to claim 19 further comprising:
- a feedback circuit responsive to said measuring circuit wherein said feedback circuit maintains said transmitted power at a desired level.

21. A radio communications device according to claim 19 wherein said transmitted power is selected from one of a plurality of predetermined power levels and wherein said measuring circuit comprises:
- first and second attenuation circuits that provide respective first and second samples of said coupled portion of said transmitted power at respective first and second levels of attenuation during said spaced apart intervals of time; and
- a multiplexer that multiplexes said first sample of said coupled portion of said transmitted power for a first range of said predetermined power levels and for multiplexing said second sample of said coupled portion of said transmitted power for a second range of said predetermined power levels.

22. A radio communications device according to claim 21 wherein said first and second attenuation circuits comprise respective first and second voltage dividers, wherein said first voltage divider is coupled between said switch and a reference voltage, and wherein said second voltage divider is coupled between an output node of said first voltage divider and said reference voltage.

23. A radio communications device according to claim 19 wherein each of said spaced apart intervals of time is less than 5 ms while transmitting radio communications.

24. A radio communications device according to claim 19 wherein said portion of said transmitted power is coupled at a frequency in a range outside an audio range of the radio communications device while transmitting radio communications.

25. A radio communications device according to claim 24 wherein said frequency is chosen from a range selected from the group consisting of less than 300 Hz and greater than 3000 Hz.

26. A radio communications device according to claim 19 wherein said radio communications device provides analog communications and wherein said switch couples said portion of said transmitted power during said spaced apart intervals of time and blocks coupling of said portion of said transmitted power between said spaced apart intervals of time during transmission of said analog communications.

27. A radio communications device according to claim 19 wherein the transmitter compensates for transmission power coupled away from the antenna during said spaced apart intervals of time while transmitting radio communications.

28. A radio communications device according to claim 19 wherein said wherein said transmitter transmits radio communications continuously during a transmit interval such that said amplifier generates said transmitted power continuously over said transmit interval, wherein two of said spaced apart intervals of time occur within said transmit interval so that said switch blocks coupling of said portion of said transmitted power away from the antenna between said spaced apart intervals of time within said transmit interval.

29. A radio communications device wherein said radio communications device provides both analog and time division multiple access (TDMA) communications, said radio communications device comprising:
- a transmitter that transmits radio communications at a transmitted power;
- a switch that couples a portion of said transmitted power during spaced apart intervals of time wherein said spaced apart intervals of time occur while transmitting radio communications and that blocks coupling of said portion of said transmitted power between said spaced apart intervals of time; and
- a measuring circuit that measures said coupled portion of said transmitted power during said spaced apart intervals of time.

30. A radio communications device comprising:
- a transmitter that transmits radio communications at a transmitted power that is selected from one of a plurality of predetermined power levels wherein said transmitter comprises an amplifier that generates said transmitted power and an antenna that transmits said transmitted power;
- first and second attenuation circuits that provide respective first and second samples of a coupled portion of said predetermined power at respective first and second levels of attenuation;
- a multiplexer that multiplexes said first sample of said coupled portion of said transmitted power for a first range of said predetermined power levels and that multiplexes said second sample of said coupled portion of said transmitted power for a second range of said predetermined power levels;
- a measuring circuit that measures said multiplexed sample of said coupled portion of said transmitted power; and
- a switch between said transmitter and said first and second attenuating circuits wherein said switch couples a portion of said transmitted power generated by said amplifier away from said antenna during spaced apart intervals of time, wherein said spaced apart intervals of time occur while transmitting radio communications and wherein said switch blocks coupling of said portion of said transmitted power away from said antenna between said spaced apart intervals of time.

31. A radio communications device according to claim 30 further comprising:
- a feedback circuit responsive to said measuring circuit wherein said feedback circuit maintains said transmitted power at a desired one of said predetermined power levels.

32. A radio communications device according to claim 30 wherein said first and second attenuating circuits comprise respective first and second voltage dividers, wherein said first voltage divider is coupled between said transmitter and a reference voltage, and wherein said second voltage divider is coupled between an output node of said first voltage divider and said reference voltage.

33. A radio communications device according to claim 30 wherein each of said spaced apart intervals of time is less than 5 ms while transmitting radio communications.

34. A radio communications device according to claim 30 wherein said portion of said transmitted power is coupled at a frequency in a range outside an audio range of the radio communications device while transmitting radio communications.

35. A radio communications device according to claim 34 wherein said frequency is in a range selected from the group consisting of less than 300 Hz and greater than 3000 Hz.

36. A radio communications device wherein said radio communications device provides both analog and time division multiple access (TDMA) communications, said radio communications device comprising:
   a transmitter that transmits radio communications at a transmitted power that is selected from one of a plurality of predetermined power levels;
   first and second attenuation circuits that provide respective first and second samples of a coupled portion of said predetermined power at respective first and second levels of attenuation;
   a multiplexer that multiplexes said first sample of said coupled portion of said transmitted power for a first range of said predetermined power levels and that multiplexes said second sample of said coupled portion of said transmitted power for a second range of said predetermined power levels;
   a measuring circuit that measures said multiplexed sample of said coupled portion of said transmitted power; and
   a switch between said transmitter and said first and second attenuating circuits wherein said switch couples a portion of said transmitted power during spaced apart intervals of time, wherein said spaced apart intervals of time occur while transmitting radio communications and wherein said switch blocks coupling of said portion of said transmitted power between said spaced apart intervals of time wherein said switch couples said portion of said transmitted power during said spaced apart intervals of time and said switch blocks coupling of said portion of said transmitted power between said spaced apart intervals of time during transmission of said analog communication, and wherein said switch couples said portion of said transmitted power during a complete transmission of said time division multiple access (TDMA) communication.

37. A method for operating a radio communications device, said method comprising the steps of:
   transmitting radio communications at a transmitted power wherein said transmitted power is generated by an amplifier and wherein said transmitted power is transmitted by an antenna;
   coupling a portion of said transmitted power generated by the amplifier away from the antenna during spaced apart intervals of time wherein said spaced apart intervals of time occur while transmitting radio communications and blocking coupling of said portion of said transmitted power away from the antenna between said spaced apart intervals of time; and
   measuring said coupled portion of said transmitted power during said spaced apart intervals of time.

38. A method according to claim 37 further comprising:
   maintaining said transmitted power at a desired level responsive to said coupled portion of said transmitted power.

39. A method according to claim 37 wherein said transmitted power is selected from one of a plurality of predetermined power levels and wherein said method further comprises the steps of:
   providing respective first and second samples of said coupled portion of said predetermined power at respective first and second levels of attenuation during said spaced apart intervals of time;
   multiplexing said first sample of said coupled portion of said transmitted power for a first range of said predetermined power levels; and
   multiplexing said second sample of said coupled portion of said transmitted power for a second range of said predetermined power levels.

40. A method according to claim 37 wherein each of said spaced apart intervals of time is less than 5 ms while transmitting radio communications.

41. A method according to claim 37 wherein said portion of said transmitted power is coupled at a frequency in a range outside an audio range of the radio communications device while transmitting radio communications.

42. A method according to claim 41 wherein said frequency is chosen from a range selected from the group consisting of less than 300 Hz and greater than 3000 Hz.

43. A method according to claim 37 further comprising the step of compensating for transmission power coupled away from the antenna during said spaced apart intervals of time while transmitting radio communications.

44. A method according to claim 37 wherein said wherein said step of transmitting radio communications comprises transmitting radio communications continuously during a transmit interval such that said amplifier generates said transmitted power continuously over said transmit interval, wherein two of said spaced apart intervals of time occur within said transmit interval so that blocking coupling of said portion of said transmitted power away from the antenna between said spaced apart intervals of time occurs within said transmit interval.

45. A method for operating a radio communications device wherein said radio communications device provides both analog and time division multiple access (TDMA) communications, said method comprising the steps of:
   transmitting radio communications at a transmitted power;
   coupling a portion of said transmitted power during spaced apart intervals of time wherein said spaced apart intervals of time occur while transmitting radio communications and blocking coupling of said portion of said transmitted power between said spaced apart intervals of time wherein said coupling step comprises,
      coupling said portion of said transmitted power during said spaced apart intervals of time and for blocking coupling of said portion of said transmitted power between said spaced apart intervals of time during transmission of said analog communication, and
      coupling said portion of said transmitted power during a complete transmission of said time division multiple access (TDMA) communication; and
   measuring said coupled portion of said transmitted power during said spaced apart intervals of time.

46. A method for operating a radio communications device, said method comprising the steps of:
   transmitting radio communications from an antenna at a transmitted power that is selected from one of a plurality of predetermined power levels wherein said transmitted power is generated by an amplifier and transmitted from said antenna;
   providing respective first and second samples of a coupled portion of said predetermined power at respective first and second levels of attenuation;

multiplexing said first sample of said coupled portion of said transmitted power for a first range of said predetermined power levels;

multiplexing said second sample of said coupled portion of said transmitted power for a second range of said predetermined power levels;

measuring said multiplexed sample of said coupled portion of said transmitted power;

coupling a portion of said transmitted power generated by said amplifier away from said antenna during spaced apart intervals of time wherein said spaced apart intervals of time occur while transmitting radio communications; and blocking coupling of said portion of said transmitted power away from said antenna between said spaced apart intervals of time.

47. A method according to claim 46 further comprising the step of:

maintaining said transmitted power at a desired one of said predetermined power levels responsive to said coupled portion of said transmitted power.

48. A method according to claim 46 wherein each of said spaced apart intervals of time is less than 5 ms while transmitting radio communications.

49. A method according to claim 46 wherein said portion of said transmitted power is coupled at a frequency in a range outside an audio range of the radio communications device while transmitting radio communications.

50. A method according to claim 49 wherein said frequency is chosen from a range selected from the group consisting of less than 300 Hz and greater than 3000 Hz.

51. A method for operating a radio communications device wherein said radio communications device provides both analog and time division multiple access (TDMA) communications, said method comprising the steps of:

transmitting radio communications from an antenna at a transmitted power that is selected from one of a plurality of predetermined power levels;

providing respective first and second samples of a coupled portion of said predetermined power at respective first and second levels of attenuation;

multiplexing said first sample of said coupled portion of said transmitted power for a first range of said predetermined power levels;

multiplexing said second sample of said coupled portion of said transmitted power for a second range of said predetermined power levels;

measuring said multiplexed sample of said coupled portion of said transmitted power;

coupling a portion of said transmitted power during spaced apart intervals of time wherein said spaced apart intervals of time occur while transmitting radio communications wherein said coupling step comprises:

coupling said portion of said transmitted power during said spaced apart intervals of time and blocking coupling of said portion of said transmitted power between said spaced apart intervals of time during transmission of said analog communication, and coupling said portion of said transmitted power during a complete transmission of said time division multiple access (TDMA) communication; and blocking coupling of said portion of said transmitted power between said spaced apart intervals of time.

52. A method for operating a radio communications device wherein said radio communications device provides analog communications, said method comprising the steps of:

transmitting radio communications at a transmitted power wherein said transmitted power is generated by an amplifier and wherein said transmitted power is transmitted by an antenna;

coupling a portion of said transmitted power during spaced apart intervals of time wherein said spaced apart intervals of time occur while transmitting radio communications and blocking coupling of said portion of said transmitted power between said spaced apart intervals of time wherein said coupling step comprises coupling said portion of said transmitted power generated by the amplifier away from the antenna during said spaced apart intervals of time and for blocking coupling of said portion of said transmitted power away from the antenna between said spaced apart intervals of time during transmission of said analog communications; and measuring said coupled portion of said transmitted power during said spaced apart intervals of time.

* * * * *

UNITED STATES PATENT AND TRADEMARK OFFICE
CERTIFICATE OF CORRECTION

PATENT NO.   : 6,173,163 B1
DATED        : January 9, 2001
INVENTOR(S)  : Northcutt It is certified that error appears in the above-identified patent and that said Letters Patent is hereby corrected as shown below:

Title page,
Item [*] Notice, delete the phrase "by 0 days" and insert -- by 12 days --

Signed and Sealed this

Twenty-first Day of September, 2004

JON W. DUDAS
*Director of the United States Patent and Trademark Office*